United States Patent [19]
Kubota et al.

[11] Patent Number: 5,616,927
[45] Date of Patent: Apr. 1, 1997

[54] FRAME-SUPPORTED PELLICLE FOR DUSTPROOF PROTECTION OF PHOTOMASK

[75] Inventors: Yoshihiro Kubota; Satoshi Kawakami; Yuichi Hamada; Toru Shirasaki; Yoshihiko Nagata; Meguru Kashida, all of Gunma-ken, Japan

[73] Assignee: Shin-Etsu Chemical Co., Ltd., Tokyo, Japan

[21] Appl. No.: 310,879

[22] Filed: Sep. 22, 1994

[30] Foreign Application Priority Data

Oct. 21, 1993 [JP] Japan .................................. 5-263412

[51] Int. Cl.$^6$ .................................................. G21K 5/00
[52] U.S. Cl. ............................ 250/492.2; 378/35; 355/53
[58] Field of Search ........................... 250/492.2, 492.1; 378/35; 430/5; 355/53

[56] References Cited

U.S. PATENT DOCUMENTS 5,012,500  4/1991  Watanabe et al. .................. 250/492.2

Primary Examiner—Jack I. Berman
Assistant Examiner—Kiet T. Nguyen
Attorney, Agent, or Firm—McAulay Fisher Nissen Goldberg & Kiel, LLP

[57] ABSTRACT

Proposed is an improved frame-supported pellicle, which is an integral body consisting of a rigid frame, a transparent plastic resin film adhesively bonded to one end surface of the frame in a slack-free fashion and a layer of a pressure-sensitive adhesive on the other end surface of the frame. The improvement consists in the use of a specific pressure-sensitive adhesive capable of being imparted with a greatly decreased bonding strength when it is heated at a temperature higher than a critical temperature or irradiated with UV light in a dose exceeding a critical dose so as to facilitate demounting of the frame-supported pellicle from a photomask on which the pellicle is mounted when it is to be replaced with a new pellicle without leaving any fragments of the adhesive adherent to the photomask surface.

3 Claims, 3 Drawing Sheets

RT: room temperature

FRAME-SUPPORTED PELLICLE FOR DUSTPROOF PROTECTION OF PHOTOMASK

BACKGROUND OF THE INVENTION

The present invention relates to a frame-supported pellicle used for dustproof protection of a pattern-bearing photomask used in the photolithographic patterning works of, for example, a resist layer in the manufacturing process of various kinds of electronic devices such as semiconductor devices, liquid crystal display panels and the like. More particularly, the invention relates to a frame-supported pellicle which is easily demountable from the photomask on which it is mounted so as to ensure good replaceability of pellicles in the patterning works.

As is known, the photolithographic method is well established in the patterning works for the manufacture of semiconductor devices, such as LSIs, VLSIs and the like, liquid crystal display panels and other fine electronic materials, in which a photoresist layer formed on the surface of a substrate such as a semiconductor silicon wafer is pattern-wise exposed to ultraviolet light through a pattern-bearing transparency called a photomask followed by development of the latent images to form a patterned resist layer. In view of the extremely high fineness and precision required in this patterning work, it is very important that the photomask is absolutely dust-free since, when dust particles are deposited on the photomask, the ultraviolet light passing through the photomask is necessarily scattered by the dust particles to give a great adverse influences on the quality of the reproduced pattern such as fidelity to the photomask pattern and contrast of the reproduced images.

It is therefore a usual practice that the photolithographic patterning work is conducted in a clean room under an atmosphere of air freed from any floating dust particles as completely as possible although a perfect dust-free condition can hardly be obtained even in a clean room of the highest class. Accordingly, it is also a usual practice that deposition of dust particles from the atmosphere on to the photomask is prevented by mounting a flame-supported dustproof pellicle on the photomask. The frame-supported dustproof pellicle mentioned above is an integral device consisting of a frame made from a rigid material, such as an aluminum alloy, and having parallel end surfaces and a thin, highly transparent film of a polymeric resin, which is called a pellicle membrane, spread over and adhesively bonded to one end surface of the pellicle frame in a drumhead-like slack-free fashion. Usually, the other end surface of the pellicle frame, reverse to the end surface to which the pellicle membrane is adhesively bonded, is coated with a pressure-sensitive adhesive so as to ensure reliableness of mounting of the pellicle frame on the photomask.

When a flame-supported pellicle is mounted on the photomask, the dust particles floating in the atmospheric air and falling therefrom are never deposited directly on the photomask but are deposited on the pellicle membrane. Since the light beams used for the pattern-wise exposure to light are focused at the patterned images on the photomask, the dust particles deposited on the pellicle membrane, which is held apart above the photomask by the height of the pellicle frame, have little adverse influences on the quality of the pattern reproduction in the photolithographic patterning work.

Although an assembly of a photomask and a frame-supported pellicle mounted thereon by means of a pressure-sensitive adhesive can be used as such in many times of repeated pattern-wise exposure works as mounted on an exposure machine, it sometimes occurs that the pellicle membrane having a so small thickness is broken in the mounting and demounting procedure of the assembly on and from the exposure machine. Such a trouble takes place more readily after prolonged use of the frame-supported pellicle because exposure to intense ultraviolet light necessarily causes embrittlement of the pellicle membrane due to the photochemical degradation of the polymeric resin forming the membrane. Once the pellicle membrane is broken, needless to say, the broken pellicle must be demounted from the photomask and replaced with a new frame-supported pellicle.

The above mentioned replacement of a broken pellicle with a new pellicle, however, is not a so simple matter as it may seem to be. Since the frame-supported pellicle mounted on a photomask is secured at the position by means of a pressure-sensitive adhesive forming an adhesive layer on one end surface of the pellicle frame or between the end surface of the pellicle frame and the surface of the photomask, the pressure-sensitive adhesive adherent to the photomask surface can never be completely removed when the pellicle frame having the broken pellicle membrane is lifted therefrom. Accordingly, it is necessary for replacing the broken pellicle with a new pellicle that the pressure-sensitive adhesive left adherent to the photomask surface is completely removed before a new pellicle is mounted. The adherent adhesive can of course be removed by a mechanical means, for example, by rubbing with a cloth. Such a mechanical cleaning means, however, can hardly be undertaken because the cleaning work unavoidably involves a risk of damages caused on the expensive photomask if not to mention that complete removal of the adherent adhesive requires a considerable time and labor. Alternatively, the adherent pressure-sensitive adhesive can be dissolved away with an organic solvent or, at least, can be swollen, as a consequence of partial crosslinking of the adhesive molecules by the ultraviolet irradiation, with an organic solvent so as to facilitate mechanical removal thereof from the photomask surface. Use of an organic solvent as a remover agent, however, is undesirable because of the possible adverse influences on the workers' health due to the toxicity thereof in addition to the unpleasant odor.

Accordingly, it is eagerly desired to develop a means to easily demount a flame-supported pellicle from the photomask surface or to develop a frame-supported pellicle easily demountable from the photomask surface without the above described problems and disadvantages in the conventional frame-supported pellicles in the prior art.

SUMMARY OF THE INVENTION

The present invention accordingly has an object to provide a frame-supported pellicle which is easily demountable from the photomask surface without the above described problems and disadvantages in the conventional frame-supported pellicles in the prior art relative to the adhesive layer remaining as adherent to the photomask surface when a broken pellicle is removed therefrom.

Thus, the present invention provides a frame-supported pellicle which is an integral body comprising:

(a) a frame made from a rigid material having substantially parallel end surfaces;

(b) a transparent film of a synthetic resin spread over and adhesively bonded to one end surface of the frame in a slack-free fashion; and (c) a layer of a pressure-sensitive adhesive on the other end surface of the frame, the adhesive bonding strength of the pressure-sensitive adhesive being reducible by heating or by irradiating with light.

DETAILED DESCRIPTION OF THE PREFERRED EMBODIMENTS

Figure 1:
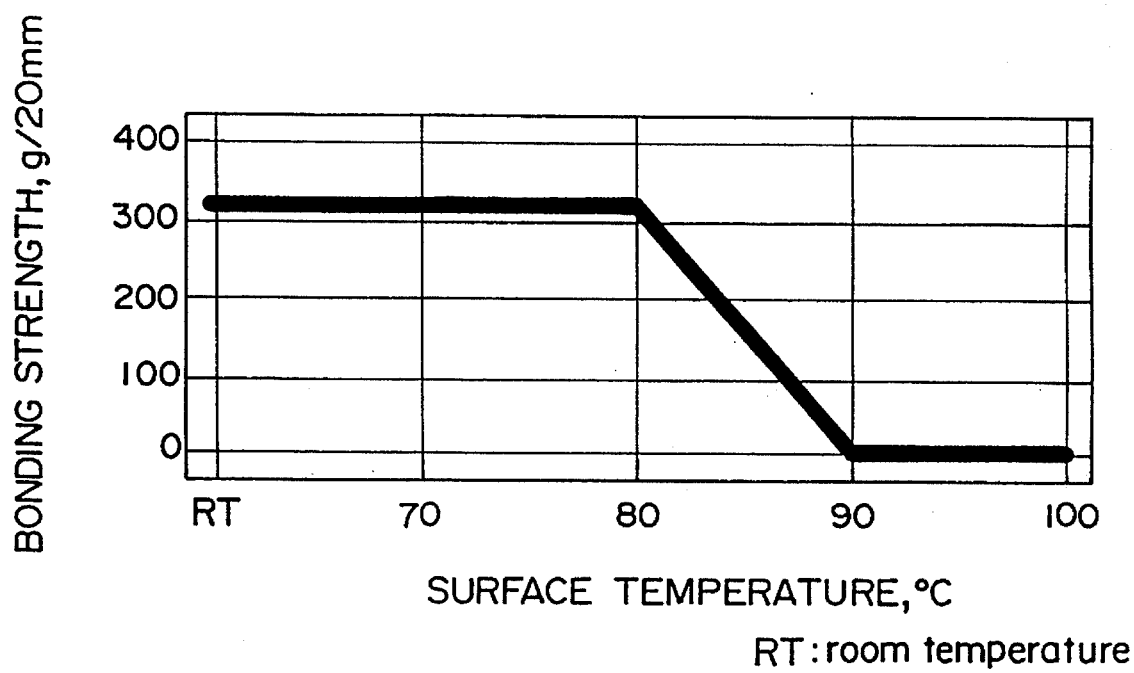
FIG. 1 is a graph showing the adhesive bonding strength of a pressure-sensitive adhesive as a function of the temperature of the substrate surface.

As is described above, the frame-supported pellicle of the invention comprises, as the essential elements, (a) a pellicle frame, (b) a pellicle membrane and (c) a layer of a pressure-sensitive adhesive, of which the pellicle frame and pellicle membrane are rather conventional and the most characteristic feature of the inventive pellicle consists in the use of a very specific pressure-sensitive adhesive which can be imparted with a reduced adhesive bonding strength when it is heated or irradiated with a radiation such as ultraviolet light. The reduction in the adhesive bonding strength of a pressure-sensitive adhesive can be caused by several different mechanisms including crosslink formation between polymeric molecules, degradation of the polymeric molecules and foaming within the adhesive layer. At any rate, it is essential that a decrease is caused in the stickiness of the surface of the adhesive layer when it is subjected to a heat treatment or to an irradiation treatment with a radiation such as ultraviolet light to such an extent that the adhesive layer left adherent to the photomask surface after removal of the pellicle frame therefrom can be easily removed to bring the surface of the photomask into a completely clean condition suitable for mounting of another frame-supported pellicle without using any risky or harmful means mentioned above.

Various kinds of pressure-sensitive adhesives are used on conventional frame-supported pellicles including those based on a polybutene resin, polyvinyl acetate resin, acrylic resin, silicone resin and the like for the purpose of securing the flame-supported pellicle mounted on a photomask but none of these conventional pressure-sensitive adhesives exhibits a reduction in the adhesive bonding strength when subjected to a heat treatment or irradiation treatment with a radiation. It is necessary accordingly that these adhesive polymers are chemically modified so as to introduce a specific functional structure susceptible to heating or irradiation with light to cause crosslinking or decomposition resulting in reduction of the adhesive bonding strength. Alternatively, the pressure-sensitive adhesive is admixed with a blowing agent so that foaming takes place in the adhesive layer to form a foamed layer having decreased surface stickiness when the layer is heated or irradiated with light. These pressure-sensitive adhesives can be applied as such to the end surface of the pellicle frame. It is optional that a foamed sheet of a rubber such as a polyurethane rubber impregnated or coated with the pressure-sensitive adhesive is attached to the end surface of the pellicle frame. It is further optional according to need that the pressure-sensitive adhesive is admixed with a filler or a pigment.

It is a desirable condition that the pressure-sensitive adhesive retains the adhesive bonding strength prolongedly with stability when the adhesive layer is at a temperature, e.g., room temperature, lower than a critical temperature or under irradiation with light of an intensity lower than a critical intensity but the adhesive bonding strength thereof is rapidly decreased when the adhesive layer is heated at a temperature higher than the critical temperature or irradiated with light of an intensity exceeding the critical intensity because otherwise the adhesive bonding strength of the adhesive layer is gradually but steadily decreased even under normal conditions eventually to cause inadvertent falling of the frame-supported pellicle from the photomask. As to the temperature of the heat treatment, the above mentioned critical temperature should be in the range from 40° C. to 300° C. or, preferably, from 70° C. to 150° C. because, when the critical temperature is too low, the decrease in the adhesive bonding strength of the adhesive layer proceeds even at room temperature while, when the critical temperature is too high, a high-temperature heat source must be brought into the clean room to uneconomically put an excessive load on the air-conditioning system of the clean room.

When the adhesive layer is irradiated with light in order to be imparted with a reduced adhesive bonding strength, the wavelength of the light is not particularly limitative provided that the desired photochemical reaction can be induced thereby in the pressure-sensitive adhesive. Since the light is desirably ultraviolet in view of the high photochemical efficiency, suitable light sources include high-pressure and low-pressure mercury lamps, metal halide lamps and the like available at low costs. It is desirable to use an ultraviolet-curable pressure-sensitive adhesive of which the adhesive bonding strength can be definitely decreased by the irradiation with ultraviolet light in an irradiation dose of 500 mJ/cm$^2$ or larger or, preferably, 200 mJ/cm$^2$ or larger. Electron beams and X-rays are, though effective for the purpose, not preferable because they can be generated only by using very expensive and large instruments.

In the following, the frame-supported pellicle of the present invention is described in more detail by way of examples.

EXAMPLE 1

A membrane having a thickness of 0.815 μm prepared from an amorphous fluorocarbon resin (Cytop, a product by Asahi Glass Co.) was spread over an end surface of a surface-anodized duralumin-made rectangular frame having outer side lengths of 120 mm by 98 mm, thickness of 2 mm and height of 5.8 mm and adhesively bonded thereto in a slack-free fashion by using a solution of the same fluorocarbon resin as the adhesive. A heat-curable pressure-sensitive adhesive tape (Liva-alpha No. 3195, a product by Nitto Denko Co.) was attached and bonded to the other end surface of the pellicle frame.

Figure 2:
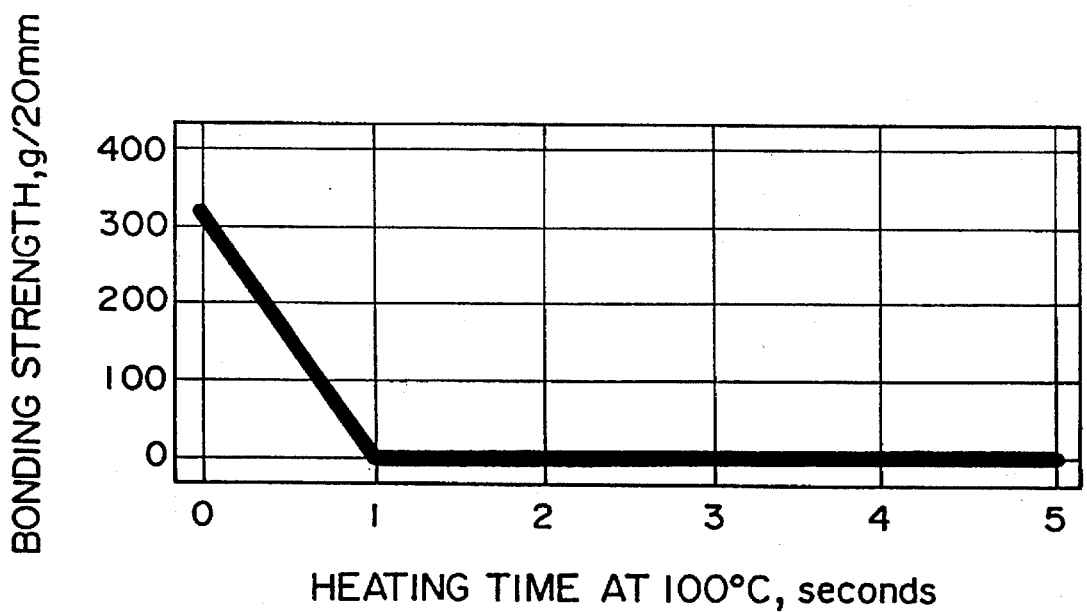
FIG. 2 is a graph showing the adhesive bonding strength of a pressure-sensitive adhesive as a function of the heating time at 100° C.

This adhesive tape can be imparted with a decreased adhesive bonding strength when it is heated as is illustrated by the graphs shown in FIGS. 1 and 2 of the accompanying drawing showing the adhesive bonding strength in g per 20 mm width as a function of the temperature at-which the adhesive tape is contacted with a metallic surface for 1 minute (FIG. 1) and as a function of the heating time in seconds when the adhesive tape is heated at 100° C.. As is understood from these graphs, the adhesive tape is stable at room temperature but rapidly loses the adhesive bonding strength when it is heated at 80° C. or higher resulting in complete loss of the bonding strength by heating for i minute at 90° C. or higher and only 1 second of heating is sufficient to cause complete disappearance of the adhesive bonding strength when the heating temperature is 100° C. or higher.

The above prepared frame-supported pellicle with the adhesive tape on one end surface of the pellicle frame was mounted on a photomask used in the patterning work for LSIs to find that reliable mounting could be obtained by virtue of the adhesive tape. The assembly of the photomask and the flame-supported pellicle mounted thereon was heated at 100° C. for 3 seconds to find that the pellicle frame could be lifted from the photomask surface without any sticking resistance due to the substantially complete loss of the adhesive bonding strength on the adhesive tape. The surface of the photomask after removal of the frame-supported pellicle therefrom was so clean with no fragments of the adhesive tape left adherent thereto that the photomask was ready for mounting of another frame-supported pellicle. In contrast thereto, an attempt was made to separate the photomask and the frame-supported pellicle without undertaking the heating treatment at 100° C. for 3 seconds to find that the attempt failed because the frame-supported pellicle could not be removed from the photomask without deformation of the pellicle frame.

EXAMPLE 2

Figure 3:
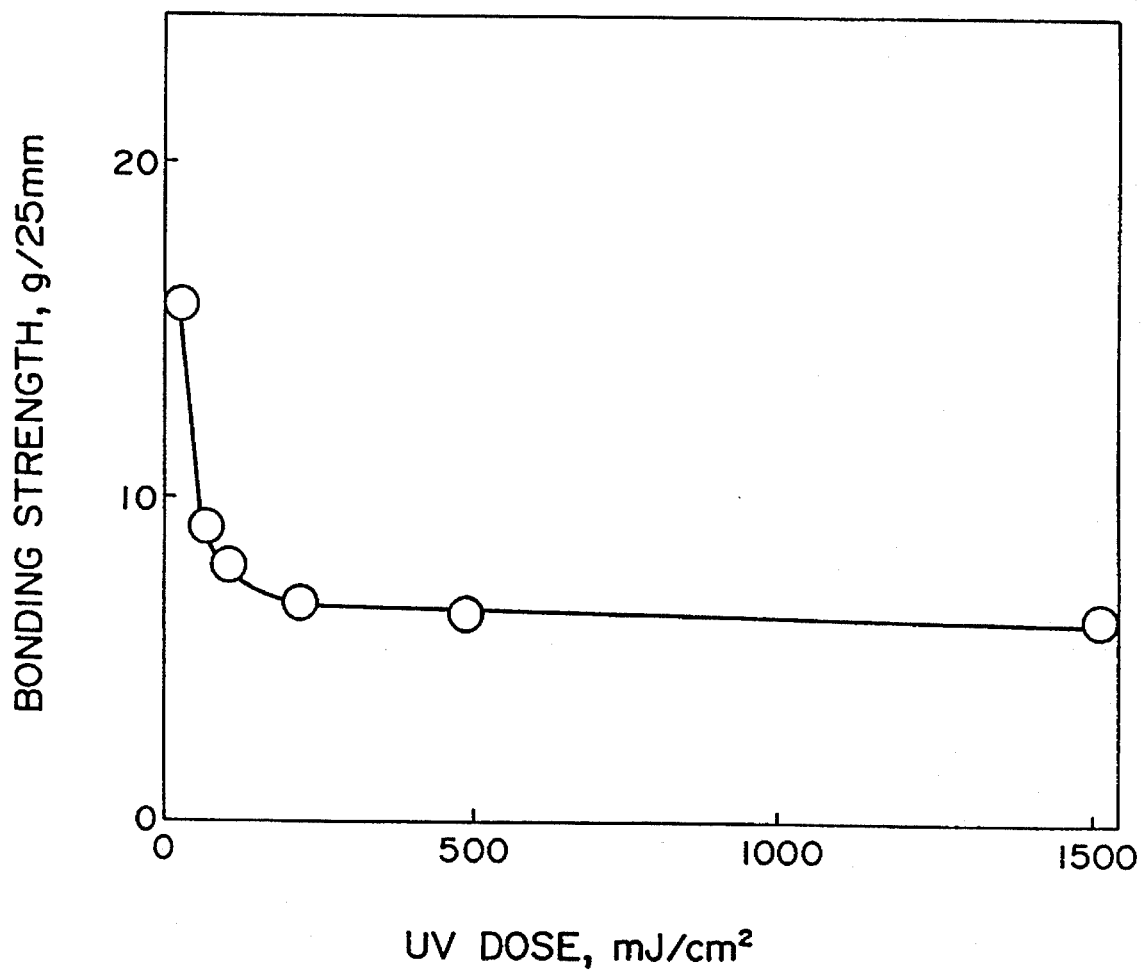
FIG. 3 is a graph showing the adhesive bonding strength of another pressure-sensitive adhesive as a function of the irradiation dose with ultraviolet light.
Figure 4:
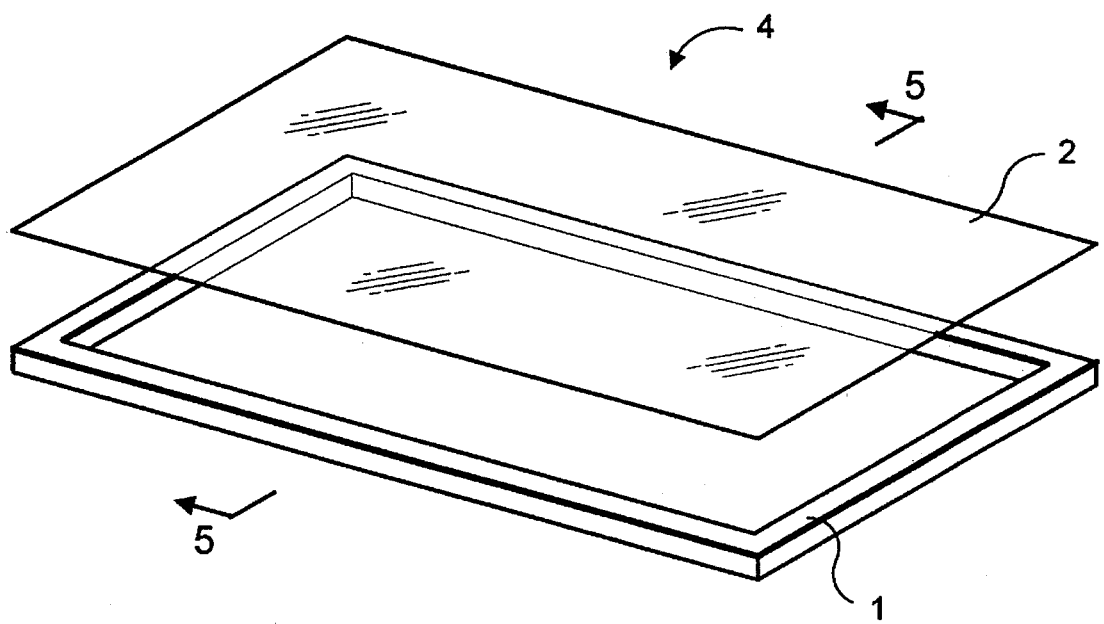
FIG. 4 is an exploded view of a frame-supported pellicle.
Figure 5:
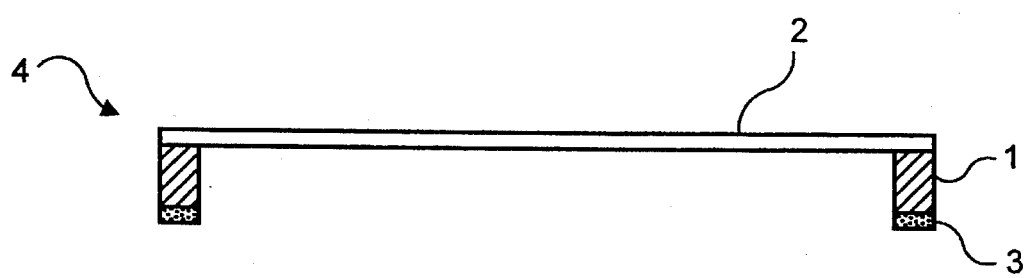
FIG. 5 is a vertical cross section along the line 5'–5' of FIG. 4.

A frame-supported pellicle was prepared in substantially the same manner as in Example 1 excepting replacement of the heat-curable pressure-sensitive adhesive tape with an ultraviolet-curable pressure-sensitive adhesive tape (UC 1827, a product of Furukawa Denko Co.). FIG. 3 of the accompanying drawing shows that the ultraviolet-curable pressure-sensitive adhesive tape exhibited a decrease in the adhesive bonding strength given in g per 25 mm width when the tape attached to a mirror-polished surface of a semiconductor silicon wafer was irradiated with ultraviolet light from a metal halide lamp of an output of 80 watts/cm at 20° C. in an atmosphere of 65% relative humidity and then peeled off the substrate surface in the direction to make an angle of 90° at a pulling velocity of 50 mm/minute.

The frame-supported pellicle with the pressure-sensitive adhesive tape on one end surface of the frame was mounted on a photomask for patterning of a liquid crystal display panel and the pressure-sensitive adhesive tape in the thus prepared assembly of the frame-supported pellicle and photomask was irradiated with ultraviolet light from a metal halide lamp in a dose of 500 mJ/cm$^2$ to cause a decrease in the adhesive bonding strength between the pellicle frame and the photomask to about ⅓ of the strength before irradiation so that the flame-supported pellicle could be easily demounted from the photomask leaving absolutely no fragments of the adhesive tape remaining on the photomask.

When the frame-supported pellicle was removed from the photomask without undertaking the ultraviolet irradiation, in contrast thereto, fragments of the adhesive tape were left adherent to the photomask surface which could be removed only after swelling with an organic solvent.

What is claimed is:

1. A frame-supported pellicle which is an integral body comprising:

(a) a frame made from a rigid material having substantially parallel end surfaces;

(b) a transparent film of a synthetic resin spread over and adhesively bonded to one end surface of the frame in a slack-free fashion; and (c) a layer of a pressure-sensitive adhesive on the other end surface of the frame, the adhesive bonding strength of the pressure-sensitive adhesive being reducible by heating or by irradiating with light.

2. The frame-supported pellicle as claimed in claim 1 in which the adhesive bonding strength of the pressure-sensitive adhesive is reducible by heating at a temperature in the range from 70° C. to 150° C.

3. The frame-supported pellicle as claimed in claim 1 in which the adhesive bonding strength of the pressure-sensitive adhesive is reducible by the irradiation with ultraviolet light in an irradiation dose of 200 mJ/cm$^2$ or larger.

* * * * *